United States Patent
Xiong et al.

(10) Patent No.: US 10,510,316 B2
(45) Date of Patent: Dec. 17, 2019

(54) CONTROL CIRCUIT, CONTROL METHOD AND DISPLAY APPARATUS

(71) Applicants: BOE Technology Group Co., Ltd., Beijing (CN); Chongqing BOE Optoelectronics Technology Co., Ltd., Chongqing (CN)

(72) Inventors: Lijun Xiong, Beijing (CN); Xiuzhu Tang, Beijing (CN); Zhi Zhang, Beijing (CN); Shuai Chen, Beijing (CN); Xing Dong, Beijing (CN); Taoliang Tang, Beijing (CN); Jingpeng Zhao, Beijing (CN); Zhenguo Tian, Beijing (CN); Xuebo Liang, Beijing (CN); Shuang Hu, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

(*) Notice: Subject to any disclaimer, the term of this patent is extended or adjusted under 35 U.S.C. 154(b) by 0 days.

(21) Appl. No.: 16/128,794

(22) Filed: Sep. 12, 2018

(65) Prior Publication Data

US 2019/0130865 A1    May 2, 2019

(30) Foreign Application Priority Data

Oct. 31, 2017 (CN) .......................... 2017 1 1049765

(51) Int. Cl.
*G09G 3/36* (2006.01)
*G05F 1/565* (2006.01)
(Continued)

(52) U.S. Cl.
CPC ............ *G09G 3/3696* (2013.01); *G05F 1/565* (2013.01); *G05F 1/62* (2013.01); *G09G 3/3677* (2013.01);
(Continued)

(58) Field of Classification Search
CPC ......... G05F 1/565; G05F 1/62; H03K 5/2472; G09G 2330/0257; G09G 2330/021
See application file for complete search history.

(56) References Cited

U.S. PATENT DOCUMENTS 9,501,997 B2   11/2016 Huang et al.
2002/0036609 A1* 3/2002 Kajihara ............ G09G 3/2011
                                                345/87
(Continued)

FOREIGN PATENT DOCUMENTS

| CN | 103236234 A | 8/2013 |
| CN | 104269148 A | 1/2015 |
| CN | 106847143 A | 6/2017 |

OTHER PUBLICATIONS

Office Action, including Search Report, for Chinese Patent Application No. 201711049765.4, dated Oct. 11, 2019, 18 pages.

*Primary Examiner* — Shaheda A Abdin
(74) *Attorney, Agent, or Firm* — Westman, Champlin & Koehler, P.A.

(57) ABSTRACT

The present disclosure provides a control circuit, a control method, and a display apparatus. The control sub-circuit is connected to a first voltage input terminal, a second voltage input terminal and the driving sub-circuit, and configured to boost a second voltage input from the second voltage input terminal to obtain a third voltage when it is detected that a first voltage input from the first voltage input terminal is lower than or equal to a first reference voltage, and output the third voltage to the driving sub-circuit; the driving sub-circuit is connected to the control sub-circuit, a fourth
(Continued)

voltage input terminal and scan lines of a display panel, and configured to output the third voltage to the scan lines when it is detected that a fourth voltage input from the fourth voltage input terminal is lower than or equal to a second reference voltage.

15 Claims, 4 Drawing Sheets

(51) Int. Cl.
*G05F 1/62* (2006.01)
*H03K 5/24* (2006.01)

(52) U.S. Cl.
CPC ... *H03K 5/2472* (2013.01); *G09G 2320/0257* (2013.01); *G09G 2330/021* (2013.01); *G09G 2330/027* (2013.01)

(56) References Cited

U.S. PATENT DOCUMENTS

| | | | |
|---|---|---|---|
| 2008/0094386 A1* | 4/2008 | Park | G09G 3/3696 345/212 |
| 2010/0156883 A1 | 6/2010 | Yamato et al. | |
| 2010/0182305 A1 | 7/2010 | Fang et al. | |
| 2011/0050670 A1* | 3/2011 | Kim | G05F 1/46 345/211 |
| 2011/0141098 A1* | 6/2011 | Yaguma | G09G 3/3688 345/212 |
| 2015/0179128 A1 | 6/2015 | Huang et al. | |

* cited by examiner

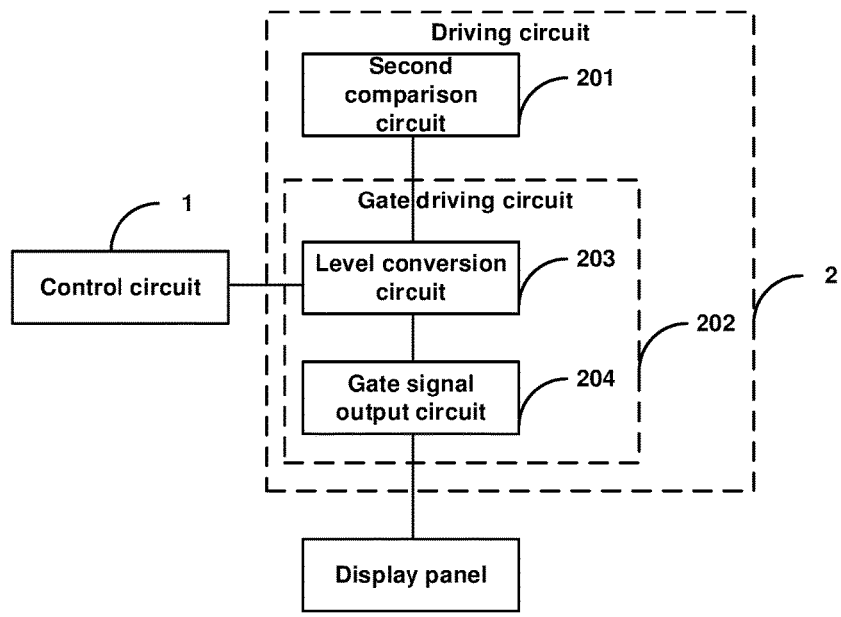

FIG. 5

| Boosting a second voltage input from a second voltage input terminal to obtain a third voltage when a control sub-circuit detects that a first voltage input from a first voltage input terminal is lower than or equal to a first reference voltage, and outputting the third voltage to a driving sub-circuit | 501 |

| outputting the third voltage to scan lines of the display panel when the driving sub-circuit detects that a fourth voltage input from a fourth voltage input terminal is lower than or equal to a second reference voltage | 502 |

FIG. 6

CONTROL CIRCUIT, CONTROL METHOD AND DISPLAY APPARATUS

CROSS REFERENCE OF APPLICATIONS

This disclosure claims the benefit of the Chinese patent application 201711049765.4, entitled "Control Circuit, Control Method and Display Apparatus," filed on Oct. 31, 2017, which is hereby incorporated herein by reference.

TECHNICAL FIELD

The disclosure relates to the field of optoelectronic display technology, and in particular, to a control circuit, a control method, and a display apparatus.

BACKGROUND

TFT-LCD (Thin Film Transistor Liquid Crystal Display) is widely used due to its excellent performance. However, there is a problem of shutdown afterimage in the TFT-LCD.

SUMMARY

The disclosure discloses a control circuit including a control sub-circuit and a driving sub-circuit;

the control sub-circuit is connected to a first voltage input terminal, a second voltage input terminal and the driving sub-circuit, and configured to boost a second voltage input from the second voltage input terminal to obtain a third voltage when it is detected that a first voltage input from the first voltage input terminal is lower than or equal to a first reference voltage, and output the third voltage to the driving sub-circuit;

the driving sub-circuit is connected to the control sub-circuit, a fourth voltage input terminal and scan lines of a display panel, and configured to output the third voltage to the scan lines when it is detected that a fourth voltage input from the fourth voltage input terminal is lower than or equal to a second reference voltage.

According to an embodiment, the control sub-circuit includes a first comparison circuit, a first output circuit, and a boost control circuit;

the first comparison circuit is connected to the first voltage input terminal, the first output circuit and the boost control circuit, and configured to compare the first voltage and the first reference voltage, and output, according to a comparison result, a first enabling signal to the first output circuit and the boost control circuit respectively;

the first output circuit is connected to the second voltage input terminal, the first comparison circuit and the driving sub-circuit, and configured to output the second voltage to the driving sub-circuit when the first enabling signal meets a first preset condition;

the boost control circuit is connected to the second voltage input terminal, the first comparing circuit and the driving sub-circuit, and configured to boost the second voltage to the third voltage and output the third voltage to the driving sub-circuit when the first enabling signal meets a second preset condition.

According to an embodiment, the first output circuit includes: an inverter and a first transistor, the first transistor includes a first control electrode, a first electrode and a second electrode;

the inverter is connected to the first comparison circuit and the first control electrode, and configured to output a signal having a phase opposite to that of the first enabling signal to the first control electrode according to the first enabling signal;

the first electrode of the first transistor is connected to the second voltage input terminal, and the second electrode of the first transistor is connected to the driving sub-circuit; the first transistor is configured to output, by the second electrode, the second voltage to the driving sub-circuit when the signal output by the inverter to the first control electrode turns on the first transistor.

According to an embodiment, the boost control circuit includes: a second transistor and a boost circuit;

the second transistor includes a second control electrode, a third electrode and a fourth electrode; the second control electrode is connected to the first comparison circuit, the third electrode is connected to the second voltage input terminal, and the fourth electrode is connected to the boost circuit;

the boost circuit is connected to the fourth electrode and the driving sub-circuit; and configured to boost the second voltage to the third voltage and output the third voltage to the driving sub-circuit when the first enabling signal turns on the second transistor;

wherein the second transistor has the same channel type as the first transistor.

According to an embodiment, the first comparison circuit includes: a first voltage comparator, an inverted terminal of the first voltage comparator is connected to the first voltage input terminal, and an in-phase terminal of the first voltage comparator is connected to the first reference voltage;

the first output circuit is configured to output the second voltage to the driving sub-circuit when the first voltage is higher than the first reference voltage and the first enabling signal is a low level signal;

the boost control circuit is configured to boost the second voltage to the third voltage and output the third voltage to the driving sub-circuit when the first voltage is lower than or equal to the first reference voltage and the first enabling signal is a high level signal.

According to an embodiment, the first transistor and the second transistor are N-type transistors.

According to an embodiment, the driving sub-circuit includes a second comparison circuit and a gate driving circuit;

the second comparison circuit is connected to the fourth voltage input terminal and the gate driving circuit, and configured to compare the fourth voltage and the second reference voltage, and output, according to a comparison result, a second enabling signal to the gate driving circuit;

the gate driving circuit is connected to the control sub-circuit, the second comparison circuit and the scan lines of the display panel, and configured to output the third voltage to the scan lines when the second enabling signal meets a third preset condition.

According to an embodiment, the second comparison circuit includes: a second voltage comparator, an in-phase terminal of the second voltage comparator is connected to the fourth voltage input terminal, and an inverted terminal of the second voltage comparator is connected to the second reference voltage;

the gate driving circuit is configured to output the third voltage to the scan lines when the fourth voltage is lower than or equal to the second reference voltage and the second enabling signal is a low level signal.

According to an embodiment, the fourth voltage is a voltage that is obtained by processing the first voltage by a power manager of the display panel and provided to digital circuitry of the display panel.

The disclosure also discloses a control method applied to the control circuit according to any of the above, the control method including:

boosting a second voltage input from a second voltage input terminal to obtain a third voltage when a control sub-circuit detects that a first voltage input from a first voltage input terminal is lower than or equal to a first reference voltage, and outputting the third voltage to a driving sub-circuit;

outputting the third voltage to scan lines of the display panel when the driving sub-circuit detects that a fourth voltage input from a fourth voltage input terminal is lower than or equal to a second reference voltage.

According to an embodiment, when the control sub-circuit detects that the first voltage is higher than the first reference voltage, a second voltage is output to the driving sub-circuit.

According to an embodiment, the fourth voltage is a voltage that is obtained by processing the first voltage by a power manager of the display panel and provided to digital circuitry of the display panel.

The disclosure also discloses a display apparatus including the control circuit according to any of the above.

According to an embodiment, the display apparatus further includes a PCB board, and the control circuit is located on the PCB board.

BRIEF DESCRIPTION OF THE DRAWINGS

In order to more clearly illustrate the technical solutions of the embodiments of the present disclosure, drawings to be used in the description of the embodiments of the present disclosure will be briefly described below. It is obvious that the drawings in the following description are only some embodiments of the present disclosure. Other drawings may also be obtained by those of ordinary skill in the art according to these drawings without any inventive effort.

FIG. 5 is a structural block diagram of a control circuit according to an embodiment of the present disclosure; and FIG. 6 is a flow of steps of a control method according to an embodiment of the present disclosure.

DETAILED DESCRIPTION

In order to make the above described objects, features and advantages of the present disclosure more apparent, the disclosure will be further described in detail in connection with the drawings and the detailed description.

Regarding the problem of shutdown afterimage in the TFT-LCD, one solution is that a driving circuit (e.g. a power supply integrated circuit (POWER IC) or a level shifter integrated circuit (Level Shifter IC)), when detecting that a power supply voltage VDDin supplied to the display panel driving circuit has been dropped to a preset voltage Vref, is triggered to pull up all the signals Gouts, which are outputted to scan lines respectively, to a turn-on voltage VGH level that is supplied to the scan lines during a normal display of the display panel, and the thin film transistors (TFTs) of the pixel electrodes of all the lines are all turned on to discharge the display panel. However, due to the power consumption and output delay of the display panel's own wiring, the potential of VGH will drop rapidly by the back-end load consumption during shutdown, and the drive circuit needs some response time to pull up the Gout signal provided to all scan lines to the VGH, which causes the amplitude of the VGH that is actually supplied to the scan lines to decrease, and the discharge time of the pixels is shortened, so that the charge in the display panel cannot be completely released, there is still a shutdown afterimage, and a splash screen effect may appear when the display panel is rapidly turned on multiple times. Especially for a device pursuing fast turn-on and turn-off, with the upgrade of the Bios of the device, the VDDin falling speed may speed up, which will lead to a more serious shutdown afterimage.

Figure 1:
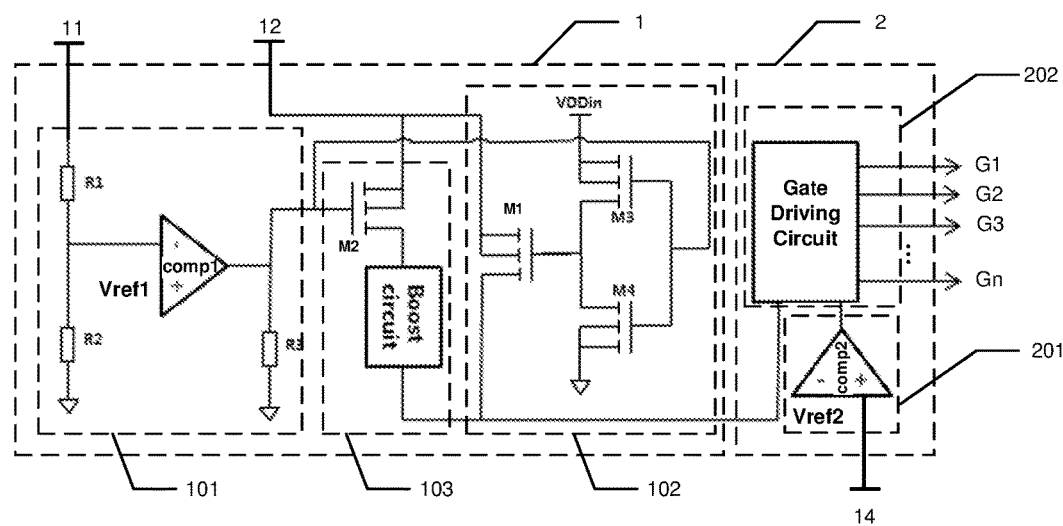
FIG. 1 is a schematic structural diagram of a control circuit according to an embodiment of the present disclosure.

The embodiment of the present disclosure discloses a control circuit for a display panel. Referring to FIG. 1, the control circuit may include a control sub-circuit 1 and a driving sub-circuit 2.

Particularly, the control sub-circuit 1 is connected to a first voltage input terminal 11, a second voltage input terminal 12 and the driving sub-circuit 2, and configured to boost a second voltage input from the second voltage input terminal 12 to obtain a third voltage when it is detected that a first voltage input from the first voltage input terminal 11 is lower than or equal to a first reference voltage Vref1, and output the third voltage to the driving sub-circuit 2.

The driving sub-circuit 2 is connected to the control sub-circuit 1, a fourth voltage input terminal 14 and scan lines G1、G2 . . . Gn of a display panel, and configured to output the third voltage to the scan lines G1、G2 . . . Gn when it is detected that a fourth voltage input from the fourth voltage input terminal 14 is lower than or equal to a second reference voltage.

In a practical implementation, the first voltage may be a power supply voltage VDDin supplied to the display panel driving circuit; the second voltage may be a gating voltage VGH supplied to each scan line by the display panel during a normal display process, and the third voltage obtained by boosting the second voltage VGH may be represented by VGHH; the fourth voltage may be the first voltage VDDin, or may be the power supply voltage DVDD that is obtained by processing the power supply voltage of the display panel driving circuit by a power manager of the display panel and provided to digital circuitry.

The control circuit provided in this embodiment includes a control sub-circuit and a driving sub-circuit; firstly, the second voltage is boosted, by the control sub-circuit, to the third voltage before triggering the driving sub-circuit to output a voltage to each scan line after a shutdown, the third voltage is output to the driving sub-circuit and then output by the driving sub-circuit to each scan line. By boosting the voltage output to each scan line, the voltage drop resulted from the power consumption or output delay of the display panel' own wiring may be partially compensated, which prolongs the turn-on time of the thin film transistor in the display panel as compared with the related art, so as to completely release the charge in the display panel, achieve the purpose of eliminating the shutdown afterimage, and avoid the splash screen which occurs when the display panel is rapidly turned on multiple times.

In an embodiment, the specific structure of the control sub-circuit 1 is further described with reference to FIG. 1. The control sub-circuit 1 may include a first comparison circuit 101, a first output circuit 102, and a boost control circuit 103.

The first comparison circuit 101 is connected to the first voltage input terminal 11, the first output circuit 102 and the boost control circuit 103, and configured to compare the first voltage and the first reference voltage Vref1, and output, according to a comparison result, a first enabling signal to the first output circuit 102 and the boost control circuit 103 respectively. The first output circuit 102 is connected to the second voltage input terminal 12, the first comparison circuit 101 and the driving sub-circuit 2, and configured to output the second voltage to the driving sub-circuit 2 when the first enabling signal meets a first preset condition. The boost control circuit 103 is connected to the second voltage input terminal 12, the first comparing circuit 101 and the driving sub-circuit 2, and configured to boost the second voltage to the third voltage and output the third voltage to the driving sub-circuit 2 when the first enabling signal meets a second preset condition.

The first preset condition and the second preset condition may be set according to a signal connection relationship of the first comparison circuit 101 and the specific structural of the first output circuit 102 and the boost control circuit 103, as long as the control sub-circuit 1 outputs the boosted third voltage to the driving sub-circuit 2 when the first voltage is lower than or equal to the first reference voltage Vref1, which is not specifically limited in the present application.

Particularly, the first output circuit 102 may further include: an inverter and a first transistor M1. The first transistor M1 includes a first control electrode, a first electrode and a second electrode, where an input terminal of the inverter is connected to the first comparison circuit 101, and an output terminal of the inverter is connected to the first control electrode of the first transistor M1. The inverter is configured to output a signal having a phase opposite to that of the first enabling signal to the first control electrode according to the first enabling signal output from the first comparison circuit 101. The first electrode is connected to the second voltage input terminal 12, and the second electrode is connected to the driving sub-circuit 2. The first transistor M1 outputs, via the second electrode, the second voltage to the driving sub-circuit 2 when the signal output by the inverter to the first control electrode turns on the first transistor M1. The inverter may be formed by a P-type third transistor M3 and an N-type fourth transistor M4. Of course, the inverter may be of other forms, which is not specifically limited in the present application.

The boost control circuit 103 may further include: a second transistor M2 and a boost circuit. The second transistor M2 includes a second control electrode, a third electrode and a fourth electrode. The second control electrode is connected to the first comparison circuit 101, the third electrode is connected to the second voltage input terminal 12, the fourth electrode is connected to an input terminal of the boost circuit, and an output terminal of the boost circuit is connected to the driving sub-circuit 2. When the first enabling signal turns on the second transistor M2, the boost circuit boosts the second voltage and outputs a third voltage to the driving sub-circuit 2; wherein the second transistor M2 has the same channel type as the first transistor M1.

Thus, due to the arrangement of the inverter in the first output circuit 102, the voltage signals supplied on the first control electrode of the first transistor M1 and the second control electrode of the second transistor M2 are opposite in phase. In case the first transistor M1 and the second transistor M2 have the same channel type, the first output circuit 102 and the boost control circuit 103 can be turned on only in an alternative manner, so that the control sub-circuit 1 outputs different signals to the driving sub-circuit 2 under different conditions.

Specifically, the first comparison circuit 101 may further include: a first voltage comparator COMP1. An inverted terminal "−" of the first voltage comparator COMP1 is connected to the first voltage input terminal 11, and an in-phase terminal "+" of the first voltage comparator COMP1 is connected to the first reference voltage.

In this embodiment, the solution is described taking the example that the first transistor M1 and the second transistor M2 are both N-type transistors. When the first voltage is higher than the first reference voltage Vref1, since the inverted terminal "−" of the first voltage comparator COMP1 is connected to the first voltage input terminal 11, the first enabling signal is a low level signal, and the second transistor M2 in the boost control circuit 103 is turned off at this time. The low level signal, after passing through the inverter in the first output circuit 102, becomes a high level signal with an opposite phase at the gate of the first transistor M1, thereby turning on the first transistor M1. That is, the second voltage is directly outputted by the first output circuit 102 to the driving sub-circuit 2.

When the first voltage is lower than or equal to the first reference voltage Vref1, the first enabling signal is a high level signal. The high level signal, after passing through the inverter in the first output circuit 102, becomes a low level signal with an opposite phase at the gate of the first transistor M1, thereby turning off the first transistor M1 and turning on the second transistor M2 in the boost control circuit 103. That is, the second voltage is boosted by the Boost circuit to obtain a third voltage, which is output to the driving sub-circuit 2 by the boost control circuit 103.

In this embodiment, the first voltage input terminal 11 may also be connected to the in-phase terminal "+" of the first voltage comparator COMP1 in the first comparison circuit 101, and the first reference voltage is connected to the inverted terminal "−." In this case, when the first voltage is higher than the first reference voltage Vref1, the first enabling signal is a high level signal, if the control sub-circuit 1 is required to output the second voltage to the driving sub-circuit 2 at this time, the corresponding first transistor M1 and second transistor M2 should be P-type transistors to ensure that the boost control circuit 103 in the control sub-circuit 1 outputs the third voltage to the driving sub-circuit 2 when the first voltage is lower than or equal to the first reference voltage Vref1. Since the first voltage, such as VDDin, starts to decrease after a shutdown, the control sub-circuit 1 outputs the boosted third voltage to the driving sub-circuit 2 when the first voltage is lower than or equal to the first reference voltage Vref1. The specific structure of the control sub-circuit may be determined according to an actual implementation, which is not specifically limited in this application.

In an embodiment, the driving sub-circuit 2 may further include a second comparison circuit 201 and a gate driving circuit 202. The second comparison circuit 201 is connected to the fourth voltage input terminal 14 and the gate driving circuit 202, and configured to compare the fourth voltage and the second reference voltage Vref2, and output, according to a comparison result, a second enabling signal to the gate driving circuit 202. The gate driving circuit 202 is connected to the control sub-circuit 1, the second comparison circuit 201 and the scan lines G1、G2 . . . Gn of the display panel, and configured to output the third voltage to the scan lines G1、G2 . . . Gn when the second enabling signal meets a third preset condition.

The third preset condition may be determined according to a signal connection relationship of the second comparison circuit 201 and the specific structure of the gate driving circuit 202, as long as the control sub-circuit 2 outputs the third voltage to the scan lines when the fourth voltage is lower than or equal to the second reference voltage Vref2, which is not specifically limited in this application.

Specifically, the first comparison circuit 201 may further include: a second voltage comparator COMP2. An in-phase terminal "+" of the second voltage comparator COMP2 is connected to the fourth voltage input terminal 14, and an inverted terminal "−" of the second voltage comparator COMP2 is connected to the second reference voltage. The gate driving circuit 202 may further include a level conversion circuit 203 and a gate signal output circuit 204. Referring to FIG. 5, the level conversion circuit 203 is connected to the control sub-circuit 1, the second comparing circuit 201, and the gate signal output circuit 204. In a practical implementation, the level conversion circuit 203 may be a level shifter, and is configured to output timing control signals such as STV_G, CLK1_G, CLK2_G, VSS_G and the like to the gate signal output circuit 204 when the second enabling signal meets the third preset condition, and control the gate signal output circuit 204 to output a third voltage to the scan lines G1, G2, . . . , Gn, wherein the gate signal output circuit 204 may be a GOA unit in a GOA structure, a Gate Driver IC in a COG or COF structure, etc.

When the fourth voltage is lower than or equal to the second reference voltage Vref2, the second enabling signal output by the second comparison circuit 201 to the gate driving circuit 202 is a low level signal, and the low level signal triggers the gate driving circuit 202 to output the third voltage VGHH to the scan lines G1, G2, . . . , Gn. When the control sub-circuit 1 outputs the third voltage to the driving sub-circuit 2 and the fourth voltage is higher than the second reference voltage Vref2, the driving sub-circuit 2 waits for the second enabling signal to be low and then triggers the output of the third voltage VGHH to the scan lines. In practice, the driving sub-circuit 2 can also be triggered when the second enabling signal is a high level signal, in which case the fourth voltage needs to be connected to the inverted terminal "−" of the second comparing circuit 201. Since the fourth voltage decreases after the shutdown, the present application shall trigger the driving sub-circuit 2 to output a third voltage VGHH to the scan lines when the fourth voltage is lower than or equal to the second reference voltage Vref2. The specific structures of the second comparison circuit 201 and the gate driving circuit 202 can be determined according to an actual implementation, which is not limited in this application.

In an embodiment, in order to make the output of the second comparison circuit 201 more stable and controllable, the fourth voltage is a voltage that is obtained by processing the first voltage by a power manager of the display panel and provided to the digital circuitry of the display panel. In this way, an abnormal trigger possibly caused by directly using the first voltage from a system on chip (SOC) of the front end as the input of the second comparison circuit in the related art is avoided. The abnormal trigger is mainly caused due to uncontrollable factors. For example, the abnormal trigger might be caused by a ripple and the like.

The first voltage comparator COMP1 and the second voltage comparator COMP2 in the present application may be a high-precision voltage comparator. For example, its precision may reach several hundred μV level, its power consumption is maintained within 100 μW, and its transmission delay is within several hundred ps level to guarantee a fast response, ensuring that the control sub-circuit 1 can quickly boost the second voltage VGH to the third voltage VGHH via the boost circuit before triggering the driving sub-circuit 2 to output a voltage to the scan lines.

Figure 2:
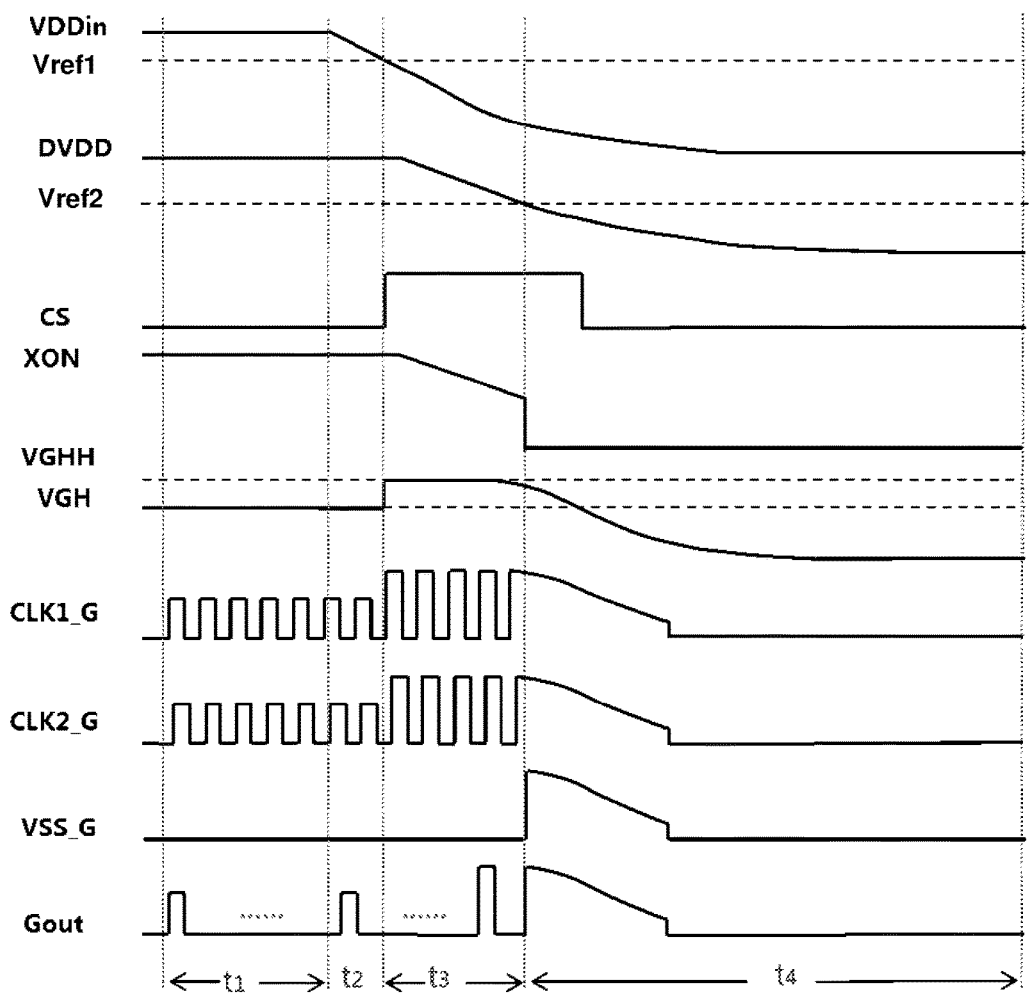
FIG. 2 is a timing diagram of an operation process of a control circuit according to an embodiment of the present disclosure.
Figure 3:
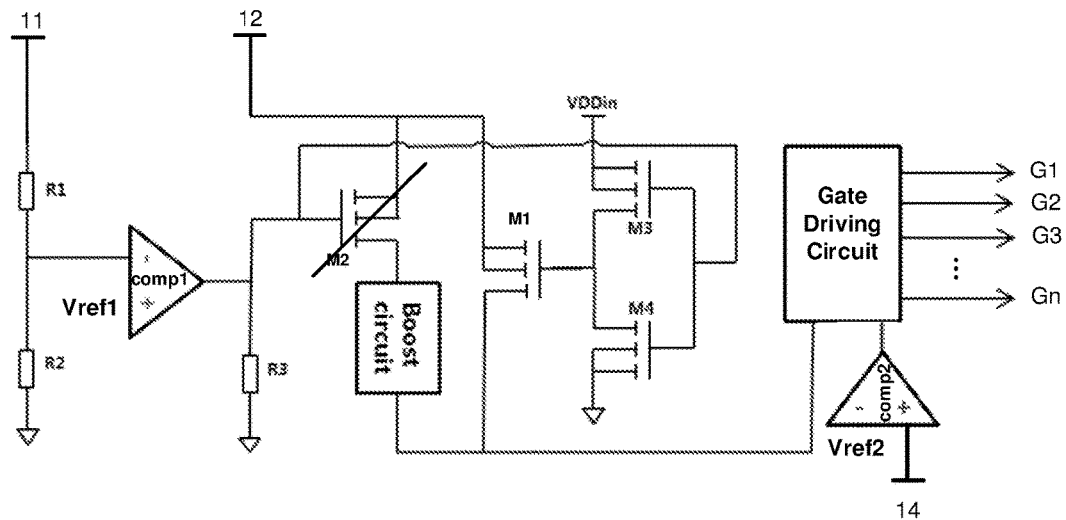
FIG. 3 is a schematic diagram of an equivalent circuit of a control circuit operating in a first phase and a second phase according to an embodiment of the present disclosure.
Figure 4:
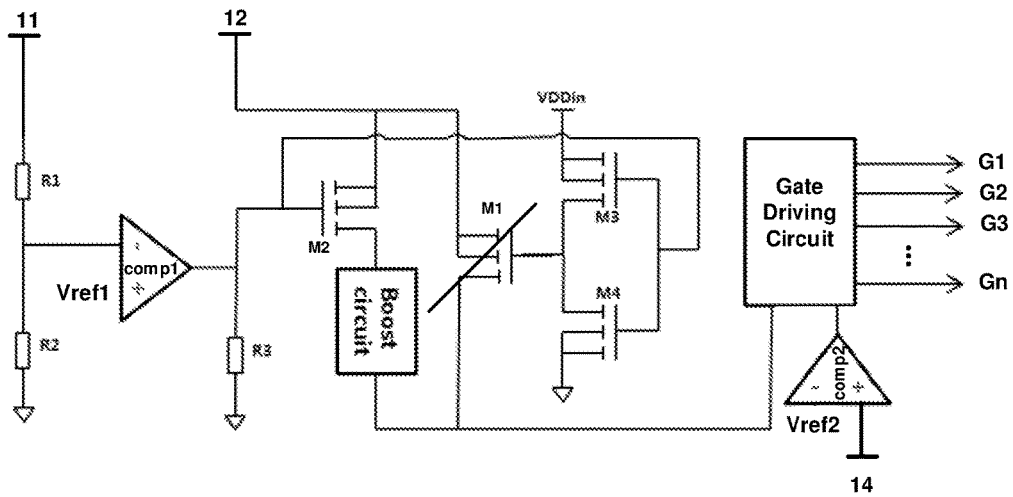
FIG. 4 is a schematic diagram of an equivalent circuit of a control circuit operating in a third phase and a fourth phase according to an embodiment of the present disclosure.

Referring to FIG. 2, a timing diagram of the operation process of the above control circuit is shown. The operation process of the control circuit at each timing phase will be explained in conjunction with the equivalent circuit diagram of the control circuit at different timing stages as shown in FIG. 3 and FIG. 4. Here, the first voltage is VDDin, the second voltage is VGH, the third voltage is VGHH, and the fourth voltage is DVDD obtained by regulating VDDin. In addition, the first transistor M1 and the second transistor M2 are N-type transistors; the first enabling signal outputted by the first comparison circuit 101 is denoted as CS, the second enabling signal outputted by the second comparison circuit 201 is denoted as XON, and the signal output from the driving sub-circuit 2 to the scan lines G1, G2, . . . , Gn is denoted as Gout.

The first stage t1 is the normal display stage before shutdown. Referring to FIG. 3, VDDin is maintained and higher than Vref1, and the first enabling signal CS output by the first comparison circuit 101 is a low level signal, M2 is turned off, and the first enabling signal CS outputs a high level signal via an inverter composed of M3 and M4 to turn on M1. At the same time, the second voltage VGH that has not been boosted enters the driving sub-circuit 2 directly, and the driving sub-circuit 2 outputs the second voltage VGH to the scan lines of the display panel according to the display driving signal of the display panel to update the pixel charge of the display panel. At this time, the voltage supply of the scan lines is mainly controlled by the display drive signal, and both the control sub-circuit 1 and the driving sub-circuit 2 operate in a low power consumption state.

At the second stage t2, the VDDin is lowered after the shutdown, but is still higher than Vref1, the first enabling signal CS output by the first comparison circuit 101 is still a low level signal, so the operation state of the control circuit is the same as that at the first stage t1, as shown in FIG. 3.

At the third stage t3, VDDin continues to decrease after shutdown, and is lower than Vref1. Referring to FIG. 4, the first enabling signal CS output by the first comparison circuit 101 is a high level signal, M2 is turned on, M1 is turned off, and the second voltage VGH enters the boost circuit, and is boosted to the third voltage VGHH and output to the driving sub-circuit 2. At this stage, although the DVDD is lowered but still higher than Vref2, the second enabling signal XON output by the second comparing circuit 202 is a high level signal. At this time, the driving sub-circuit 2 is not triggered, but waits until the second enabling signal XON is a low level signal and then outputs the third voltage VGHH to the scan lines.

At the fourth stage t4, VDDin is lower than Vref1 after the shutdown, and DVDD is lower than Vref2, the second enabling signal XON output by the second comparison circuit 202 changes from a high level signal to a low level signal, to trigger the driving sub-circuit 2 to output the third voltage VGHH to the scan lines. At the same time, STV_G, CLK1_G, CLK2_G, and VSS_G are all pulled up to the VGHH level, and sent to the GOA or COG, COF unit, so that the scan lines have enough energy and sufficient time to fully open the thin film transistor (TFT) in each line of pixels to completely release the residual charge in the display panel.

The following is an example of the reference values. For example, if VDDin is 3.3V in the normal display state, the first reference voltage Vref1 can be set to 2.5V, and the voltage DVDD obtained after regulating VDDin is, for example, 2.5V. The second reference voltage Vref2 can be set to 1.9V. In practical implementations, the second reference voltage Vref2 can be adjusted by a measured DVDD value to ensure that the control sub-circuit 1 boosts the second voltage VGH to a third voltage VGHH before the driving sub-circuit 2 is triggered. That is, the first reference voltage and the second reference voltage are set so that the first voltage is lower than or equal to the first reference voltage when the fourth voltage is lower than or equal to the second reference voltage.

In summary, the control circuit provided in this disclosure includes a control sub-circuit and a driving sub-circuit; firstly, the second voltage is boosted, by the control sub-circuit, to the third voltage before triggering the driving sub-circuit to output a voltage to each scan line after a shutdown, the third voltage is output to the driving sub-circuit and then output by the driving sub-circuit to each scan line. By boosting the voltage output to each scan line, the voltage drop resulted from the power consumption or output delay of the display panel' own wiring may be partially compensated, which prolongs the turn-on time of the TFT in the display panel as compared with the related art, so as to completely release the charge in the display panel, achieve the purpose of eliminating the shutdown afterimage, and avoid the splash screen which occurs when the display panel is rapidly turned on multiple times.

Another embodiment of the application also discloses a display apparatus including the control circuit according to any of the above. Specifically, the control circuit according to the present application can be applied to a display apparatus with a COG (Chip On Glass) or COF (Chip On Film) structure, and can also be applied to a display apparatus with a GOA (Gate On Array) structure.

In an embodiment, the display apparatus may further include a printed circuit board (PCB) board. The control circuit is located on the PCB board, and does not need to occupy the edge space of the display panel, which is beneficial to the development of a narrow bezel display panel.

Another embodiment of the present application also discloses a control method applied to the control circuit according to any of the above. Referring to FIG. 6, the control method may include:

Step 501: boosting a second voltage input from a second voltage input terminal 12 to obtain a third voltage when a control sub-circuit 1 detects that a first voltage input from a first voltage input terminal 11 is lower than or equal to a first reference voltage Vref1, and outputting the third voltage to a driving sub-circuit 2.

Step 502: outputting the third voltage to scan lines of the display panel when the driving sub-circuit 2 detects that a fourth voltage input from a fourth voltage input terminal 14 is lower than or equal to a second reference voltage Vref2.

Step 501 and step 502 correspond to the third stage t3 and the fourth stage t4 of the timing stages of the foregoing embodiment respectively, and specific operation processes are not described herein again.

In an actual operation process, when the control sub-circuit 1 detects that the first voltage is higher than the first reference voltage Vref1, the second voltage is output to the driving sub-circuit 2, which step corresponds to the first stage t1 or the first second stage t2 of the timing stages of the above embodiments, and specific operation processes are not described herein again.

In order to make the triggering of the driving sub-circuit more stable and controllable, the fourth voltage is a voltage that is obtained by regulating the first voltage by a power manager of the display panel and provided to digital circuitry of the display panel.

In summary, the present application provides a control circuit, a control method and a display apparatus. The control circuit includes a control sub-circuit and a driving sub-circuit; firstly, the second voltage is boosted, by the control sub-circuit, to the third voltage before triggering the driving sub-circuit to output a voltage to each scan line after a shutdown, the third voltage is output to the driving sub-circuit and then output by the driving sub-circuit to each scan line. By boosting the voltage output to each scan line, the voltage drop resulted from the power consumption or output delay of the display panel' own wiring may be partially compensated, which prolongs the turn-on time of the thin film transistor in the display panel as compared with the prior art, so as to completely release the charge in the display panel, achieve the purpose of eliminating the shutdown afterimage, and avoid the splash screen which occurs when the display panel is rapidly turned on multiple times.

Further, by replacing the first voltage from a front end SOC in the related art with the regulated fourth voltage, the operation state of the second comparison circuit becomes more stable, so that the triggering of the driving sub-circuit becomes more stable and controllable.

Various embodiments in the present specification are described in a progressive manner, and each embodiment focuses on differences from other embodiments, therefore the same or similar parts between various embodiments may be referred to each other.

Finally, it should also be noted that relational terms such as first and second are used herein merely to distinguish one entity or operation from another entity or operation, and do not necessarily require or imply that there is any such actual relationship or order between these entities or operations. Furthermore, terms "comprise," "contain" or any other variations thereof aim to cover a non-exclusive inclusion, so that the process, method, product or device including a series of elements includes not only these elements, but also other elements which are not explicitly listed, or it further includes elements inherent to such process, method, product or device. An element that is defined by the phrase "comprising a . . . " does not exclude the presence of additional elements in the process, method, product, or device that includes this element, unless there are other limitations.

A control circuit, a control method and a display apparatus according to the present disclosure are described above in detail. The principles and implementations of the present disclosure are described herein by applying specific examples. However, the descriptions of the above embodiments are only used to facilitate the understanding of the method of the present disclosure and its basic ideas. For those of ordinary skills in the art, there will be changes in specific embodiments and application scopes according to the ideas of the present disclosure. Therefore, the description should not be construed as limiting the disclosure.

We claim:

1. A control circuit comprising:
   a control sub-circuit connected to a first voltage input terminal, a second voltage input terminal and the driving sub-circuit, and configured to boost a second voltage input from the second voltage input terminal to obtain a third voltage when it is detected that a first voltage input from the first voltage input terminal is lower than or equal to a first reference voltage, and output the third voltage to the driving sub-circuit; and a driving sub-circuit connected to the control sub-circuit, a fourth voltage input terminal and scan lines of a display panel, and configured to output the third voltage to the scan lines when it is detected that a fourth voltage input from the fourth voltage input terminal is lower than or equal to a second reference voltage.

2. The control circuit of claim 1, wherein the control sub-circuit comprises a first comparison circuit, a first output circuit, and a boost control circuit;

the first comparison circuit is connected to the first voltage input terminal, the first output circuit and the boost control circuit, and configured to compare the first voltage and the first reference voltage, and output, according to a comparison result, a first enabling signal to the first output circuit and the boost control circuit respectively;

the first output circuit is connected to the second voltage input terminal, the first comparison circuit and the driving sub-circuit, and configured to output the second voltage to the driving sub-circuit when the first enabling signal meets a first preset condition;

the boost control circuit is connected to the second voltage input terminal, the first comparing circuit and the driving sub-circuit, and configured to boost the second voltage to the third voltage and output the third voltage to the driving sub-circuit when the first enabling signal meets a second preset condition.

3. The control circuit of claim 2, wherein the first output circuit comprises an inverter and a first transistor, the first transistor comprises a first control electrode, a first electrode and a second electrode;

the inverter is connected to the first comparison circuit and the first control electrode, and configured to output a signal having a phase opposite to that of the first enabling signal to the first control electrode according to the first enabling signal;

the first electrode of the first transistor is connected to the second voltage input terminal, and the second electrode of the first transistor is connected to the driving sub-circuit; the first transistor is configured to output, by the second electrode, the second voltage to the driving sub-circuit when the signal output by the inverter to the first control electrode turns on the first transistor.

4. The control circuit of claim 3, wherein the boost control circuit comprises a second transistor and a boost circuit;

the second transistor comprises a second control electrode, a third electrode and a fourth electrode; the second control electrode is connected to the first comparison circuit, the third electrode is connected to the second voltage input terminal, and the fourth electrode is connected to the boost circuit;

the boost circuit is connected to the fourth electrode and the driving sub-circuit, and configured to boost the second voltage to the third voltage and output the third voltage to the driving sub-circuit when the first enabling signal turns on the second transistor;

wherein the second transistor has the same channel type as the first transistor.

5. The control circuit of claim 4, wherein the first comparison circuit comprises a first voltage comparator, an inverted terminal of the first voltage comparator is connected to the first voltage input terminal, and an in-phase terminal of the first voltage comparator is connected to the first reference voltage;

the first output circuit is configured to output the second voltage to the driving sub-circuit when the first voltage is higher than the first reference voltage and the first enabling signal is a low level signal;

the boost control circuit is configured to boost the second voltage to the third voltage and output the third voltage to the driving sub-circuit when the first voltage is lower than or equal to the first reference voltage and the first enabling signal is a high level signal.

6. The control circuit of claim 5, wherein the first transistor and the second transistor are N-type transistors.

7. The control circuit of claim 1, wherein the driving sub-circuit comprises a second comparison circuit and a gate driving circuit;

the second comparison circuit is connected to the fourth voltage input terminal and the gate driving circuit, and configured to compare the fourth voltage and the second reference voltage, and output, according to a comparison result, a second enabling signal to the gate driving circuit;

the gate driving circuit is connected to the control sub-circuit, the second comparison circuit and the scan lines of the display panel, and configured to output the third voltage to the scan lines when the second enabling signal meets a third preset condition.

8. The control circuit of claim 7, wherein the second comparison circuit comprises a second voltage comparator, an in-phase terminal of the second voltage comparator is connected to the fourth voltage input terminal, and an inverted terminal of the second voltage comparator is connected to the second reference voltage;

the gate driving circuit is configured to output the third voltage to the scan lines when the fourth voltage is lower than or equal to the second reference voltage and the second enabling signal is a low level signal.

9. The control circuit of claim 8, wherein the fourth voltage is a voltage that is obtained by processing the first voltage by a power manager of the display panel and provided to digital circuitry of the display panel.

10. The control circuit of claim 9, wherein the first reference voltage and the second reference voltage are set so that the first voltage is lower than or equal to the first reference voltage when the fourth voltage is lower than or equal to the second reference voltage.

11. A display apparatus comprising the control circuit of claim 1.

12. A control method applied to a control circuit comprising a control sub-circuit and a driving sub-circuit, wherein the control sub-circuit is connected to a first voltage input terminal, a second voltage input terminal and the driving sub-circuit, and the driving sub-circuit is connected to the control sub-circuit, a fourth voltage input terminal and scan lines of a display panel; the control method comprising:

boosting a second voltage input from a second voltage input terminal to obtain a third voltage when a control sub-circuit detects that a first voltage input from a first voltage input terminal is lower than or equal to a first reference voltage, and outputting the third voltage to a driving sub-circuit;

outputting the third voltage to scan lines of the display panel when the driving sub-circuit detects that a fourth voltage input from a fourth voltage input terminal is lower than or equal to a second reference voltage.

13. The control method of claim 12, wherein when the control sub-circuit detects that the first voltage is greater than the first reference voltage, a second voltage is output to the driving sub-circuit.

14. The control method of claim 12, wherein the fourth voltage is a voltage that is obtained by processing the first voltage by a power manager of the display panel and provided to digital circuitry of the display panel.

15. The control method of claim 12, wherein the first reference voltage and the second reference voltage are set so that the first voltage is lower than or equal to the first reference voltage when the fourth voltage is lower than or equal to the second reference voltage.

* * * * *